(12) United States Patent
Chen et al.

(10) Patent No.: US 6,500,725 B1
(45) Date of Patent: Dec. 31, 2002

(54) MICROELECTRONIC FABRICATION METHOD PROVIDING ALIGNMENT MARK AND ISOLATION TRENCH OF IDENTICAL DEPTH

(75) Inventors: Chien-Chuan Chen, Kaohsiung (TW); Chiang-Jen Peng, Hsinchu (TW); Bin-Chia Su, Kaohsiung (TW); Shu-Huei Suen, Hsinchu (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/947,632

(22) Filed: Sep. 6, 2001

(51) Int. Cl.[7] ............................................. H01L 21/76
(52) U.S. Cl. ..................... 438/401; 438/424; 430/22; 430/30; 356/399; 356/400; 356/401
(58) Field of Search .................. 356/399–401; 430/22, 30; 438/401, 424

(56) References Cited

U.S. PATENT DOCUMENTS

| | | | |
|---|---|---|---|
| 5,316,966 A | * | 5/1994 | Van Der Plas et al. ..... 438/401 |
| 6,122,058 A | | 9/2000 | Van Der Werf et al. |
| 6,147,394 A | | 11/2000 | Bruce et al. |

* cited by examiner

*Primary Examiner*—Albert W. Paladini
*Assistant Examiner*—David A. Zarneke
(74) *Attorney, Agent, or Firm*—Tung & Associates

(57) ABSTRACT

Within a method for fabricating a microelectronic fabrication there is first provided a substrate. There is then formed simultaneously within the substrate an alignment mark and an isolation trench formed employing a single etch method and to an identical depth within the substrate. There is then formed within the isolation trench an isolation region. Finally, there is then further processed the substrate while aligning the substrate while using the alignment mark in conjunction with a minimum of two alignment wavelengths. The method provides for enhanced efficiency when fabricating the microelectronic fabrication. The method contemplates a microelectronic fabrication fabricated employing the method.

9 Claims, 2 Drawing Sheets

MICROELECTRONIC FABRICATION METHOD PROVIDING ALIGNMENT MARK AND ISOLATION TRENCH OF IDENTICAL DEPTH

BACKGROUND OF THE INVENTION

1. Field of the Invention

The present invention relates generally to methods for fabricating microelectronic fabrications. More particularly, the present invention relates to methods for fabricating, with enhanced efficiency, microelectronic fabrications.

2. Description of the Related Art

Microelectronic fabrications are formed from microelectronic substrates over which are formed patterned conductor layers which are separated by dielectric layers.

As microelectronic fabrication integration levels have increased and patterned conductor layer dimensions have decreased, there has evolved a continuing and intensified interest in providing methods through which microelectronic fabrications may be more efficiently fabricated. In turn, methods for efficiently fabricating microelectronic fabrications are desirable in the art of microelectronic fabrication such as to provide for cost effective microelectronic fabrication products when fabricating microelectronic fabrications.

While methods for efficiently fabricating microelectronic fabrications are thus clearly desirable in the art of microelectronic fabrication and often essential in the art of microelectronic fabrication, methods for efficiently fabricating microelectronic fabrications are nonetheless not entirely without problems in the art of microelectronic fabrication. In that regard, methods for efficiently fabricating microelectronic fabrications are often difficult to develop insofar as microelectronic fabrications methods typically involve a multiplicity of related microelectronic fabrication process tools which must be employed in synchronization for fabricating a microelectronic fabrication.

It is thus desirable in the art of microelectronic fabrication to provide methods and materials which may be employed for fabricating microelectronic fabrications, with enhanced efficiency.

It is towards the foregoing object that the present invention is directed.

Various methods, apparatus and systems have been disclosed in the art of microelectronic fabrication for forming microelectronic fabrications with desirable properties.

Included among the methods, apparatus and systems, but not limited among the methods, apparatus and systems, are methods, apparatus and systems disclosed within: (1) Van Der Werf et al., in U.S. Pat. No. 6,122,058 (an interferometric system assembled within a lithographic apparatus for fabricating a microelectronic fabrication, wherein the interferometric system employs two wavelengths such as to provide enhanced detection efficiency within the lithographic apparatus when fabricating the microelectronic fabrication therein); and (2) Bruce et al., in U.S. Pat. No. 6,147,394 (a method for fabricating a microelectronic fabrication while employing a hybrid photoresist material which comprises a negative tone component and a positive tone component, such as to form within the microelectronic fabrication three independent microelectronic fabrication regions while employing a single photolithographic masking process step).

Desirable in the art of microelectronic fabrication are additional methods and materials which may be employed for fabricating microelectronic fabrications with enhanced efficiency.

It is towards the foregoing object that the present invention is directed.

SUMMARY OF THE INVENTION

A first object of the present invention is to provide a method for fabricating a microelectronic fabrication, with enhanced efficiency.

A second object of the present invention is to provide a method for fabricating a microelectronic fabrication in accord with the first object of the invention, wherein the method is readily commercially implemented.

In accord with the objects of the present invention, there is provided by the present invention a method for fabricating a microelectronic fabrication. To practice the method of the present invention, there is first provided a substrate. There is then formed simultaneously within the substrate an alignment mark and an isolation trench formed employing a single etch method and to an identical depth within the substrate. There is then formed within the isolation trench an isolation region. Finally, there is then further processed the substrate while aligning the substrate while using the alignment mark with a minimum of two alignment wavelengths.

There is provided by the present invention a method for fabricating a microelectronic fabrication, with enhanced efficiency, wherein the method is readily commercially implemented.

The method of the present invention realizes the foregoing objects by forming simultaneously within the substrate an alignment mark and an isolation trench formed employing a single etch method and to an identical depth within the substrate. Finally, there is then further processed the substrate while aligning the substrate while using the alignment mark with a minimum of two alignment wavelengths.

The method of the present invention is readily commercially implemented.

The present invention employs methods and materials as are generally conventional in the art of microelectronic fabrication, but employed within the context of a specific application to provide the method of the present invention. Since it is thus at least in part a specific application which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material portion of this disclosure, wherein.

DESCRIPTION OF THE PREFERRED EMBODIMENT

The present invention provides a method for fabricating a microelectronic fabrication, with enhanced efficiency, wherein the method is readily commercially implemented.

The present invention realizes the foregoing objects by forming simultaneously within a substrate employed within a microelectronic fabrication an alignment mark and an isolation trench formed employing a single etch method and to an identical depth within the substrate. In addition, there is then further processed the substrate while aligning the substrate while using the alignment mark with a minimum of two alignment wavelengths.

The preferred embodiment of the present invention illustrates the present invention most particularly within the context of fabricating, with enhanced efficiency, a semiconductor integrated circuit microelectronic fabrication. However, the present invention may nonetheless be employed for fabricating, with enhanced efficiency, microelectronic fabrications selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 4, there is shown a series of schematic cross-sectional diagrams illustrating the results of progressive stages in fabricating a semiconductor integrated circuit microelectronic fabrication in accord with a preferred embodiment of the present invention.

Figure 1:
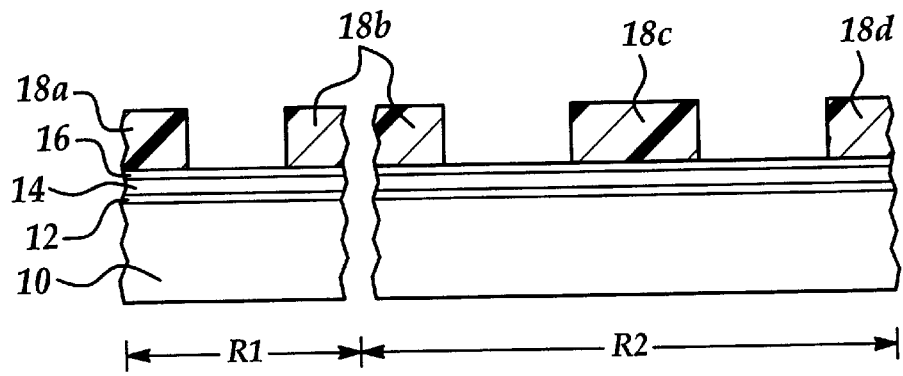
FIG. 1, FIG. 2, FIG. 3 and FIG. 4 show a series of schematic cross-sectional diagrams illustrating the results of progressive stages in forming a semiconductor integrated circuit microelectronic fabrication in accord with a preferred embodiment of the present invention.

Shown in FIG. 1 is a schematic cross-sectional diagram of the semiconductor integrated circuit microelectronic fabrication at an early stage in its fabrication in accord with the preferred embodiment of the present invention.

Shown in FIG. 1 is a semiconductor substrate 10 having formed thereupon a series of three blanket layers comprising: (1) a blanket pad oxide layer 12 formed upon the semiconductor substrate 10; (2) a blanket silicon nitride layer 14 formed upon the blanket pad oxide layer 12; and (3) an optional blanket anti-reflective coating (ARC) layer 16 formed upon the blanket silicon nitride layer 16. Finally, there is also shown within the schematic cross-sectional diagram of FIG. 1, and formed upon the optional blanket anti-reflective coating (ARC) layer 16, a series of patterned photoresist layers 18a, 18b, 18c and 18d.

Within the preferred embodiment of the present invention with respect to the semiconductor substrate 10, and although semiconductor substrates are available with either dopant polarity, several dopant concentrations and various crystallographic orientations, for the preferred embodiment of the present invention, the semiconductor substrate 10 is typically and preferably a silicon semiconductor substrate having an N- or P-doping.

Similarly, as is illustrated within the schematic cross-sectional diagram of FIG. 1, the semiconductor substrate 10 is divided into two regions. A first of the two regions is a peripheral region R1 of the semiconductor substrate 10, within which is normally formed an alignment mark. A second of the two regions is an active product region R2 of the semiconductor substrate 10, within which is normally formed at least one isolation region which separates adjacent active regions of the semiconductor substrate 10.

Within the preferred embodiment of the present invention with respect to the blanket pad oxide layer 12, the blanket pad oxide layer 12 is typically and preferably formed employing a thermal oxidation of the semiconductor substrate 10 at a temperature of from about 900 to about 950 degrees centigrade for a time period of from about 300 to about 480 minutes to form the blanket pad oxide layer 12 of silicon oxide having a thickness from about 90 to about 130 angstroms upon the semiconductor substrate 10.

Within the preferred embodiment of the present invention with respect to the blanket silicon nitride layer 14, the blanket silicon nitride layer 14 is typically and preferably formed employing a furnace deposition method which forms the blanket silicon nitride layer 14 to a thickness of from about 1500 to about 2000 angstroms upon the blanket pad oxide layer 12.

Within the preferred embodiment of the present invention with respect to the optional blanket anti-reflective coating (ARC) layer 16, the optional blanket anti-reflective coating (ARC) layer 16 is typically and preferably formed of a silicon oxynitride anti-reflective coating (ARC) material (although other anti-reflective coating (ARC) materials are not precluded), formed to a thickness of from about 250 to about 350 angstroms upon the blanket silicon nitride layer 14.

Finally, within the preferred embodiment of the present invention with respect to the series of patterned photoresist layers 18a, 18b, 18c and 18d, the series of patterned photoresist layers 18a, 18b, 18c and 18d may be formed of photoresist materials as are conventional in the art of microelectronic fabrication, including but not limited to positive photoresist materials and negative photoresist materials. Typically and preferably, each of the patterned photoresist layers 18a, 18b, 18c and 18d is formed to a thickness of from about 5000 to about 8000 angstroms upon the optional blanket anti-reflective coating (ARC) layer 16.

Within the preferred embodiment of the present invention, the pair of patterned photoresist layers 18a and 18b is typically and preferably separated by an aperture of width of from about 1200 to about 2000 microns, which corresponds with an alignment mark desired to be formed within the peripheral region R1 of the semiconductor substrate 10. Similarly, the pairs of patterned photoresist layers 18b and 18c or 18c and 18d are typically and preferably separated by an aperture width, which corresponds with a pair of isolation trenches desired to be formed within the active product region R2 of the semiconductor substrate 10.

Figure 2:
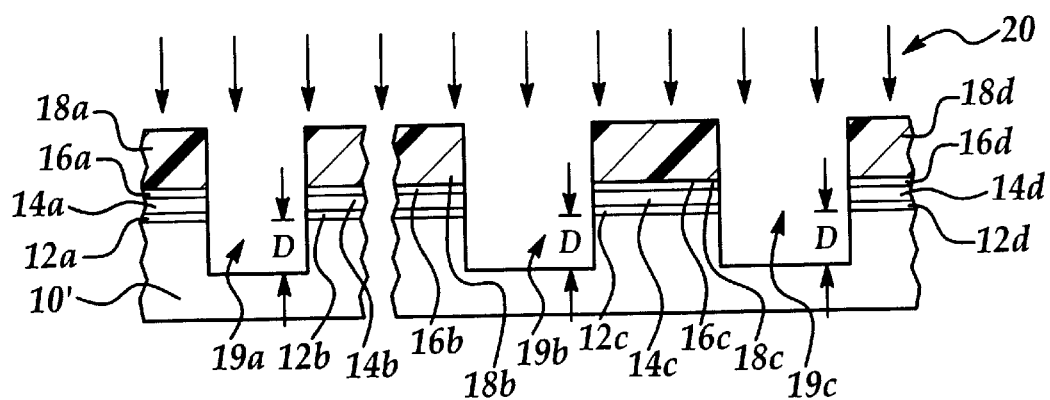

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein, in a first instance, the optional blanket anti-reflective coating (ARC) layer 16, the blanket silicon nitride layer 14 and the blanket pad oxide layer 12 have been patterned to form a corresponding series of: (1) optional patterned anti-reflective coating (ARC) layers 16a, 16b, 16c and 16d; (2) patterned silicon nitride layers 14a, 14b, 14c and 14d; and (3) patterned pad oxide layers 12a, 12b, 12c and 12d, while employing the series of patterned photoresist layers 18a, 18b, 18c and 18d as a series of etch mask layers, in conjunction with an etching plasma 20. Similarly, in a second instance, there is also shown within the schematic cross-sectional diagram of FIG. 2 the results of etching the semiconductor substrate 10 to form an etched semiconductor substrate 10' having formed therein an alignment mask 19a within the peripheral region R1 of the etched semiconductor substrate 10' and a pair of isolation trenches 19b and 19c within the active product region R2 of the etched semiconductor substrate 10', as also formed while employing the series of patterned photoresist layers 18a, 18b, 18c and 18d as the etch mask layer, along with the etching plasma 20.

Within the present invention and the preferred embodiment of the present invention with respect to the alignment mark 19a and the pair of isolation trenches 19b and 19c, the alignment mark 19a and the pair of isolation trenches 19b and 19c are formed to an identical depth D within the etched semiconductor substrate 10' when formed while employing the same etching plasma 20. Within the preferred embodiment of the present invention with respect to the etching plasma 20, the etching plasma 20 will typically and preferably employ an etchant gas composition, or more generally a series of etchant gas compositions, as is conventional in the art of microelectronic fabrication and appropriate to a series of materials from which is formed the optional blanket anti-reflective coating (ARC) layer 16, the blanket silicon nitride layer 14, the blanket pad oxide layer 12 and the semiconductor substrate 10. Such a series of etchant gas compositions will typically and preferably comprise at least one fluorine containing etchant gas composition, followed by a chlorine containing etchant gas composition.

Within the preferred embodiment of the present invention, the identical depth D to which is simultaneously formed the alignment mask 19a and the pair of isolation trenches 19b and 19c within the etched semiconductor substrate 10' is from about 3000 to about 4500 angstroms, more preferably from about 3200 to about 4200 angstroms and most preferably from about 3500 to about 4000 angstroms.

Figure 3:
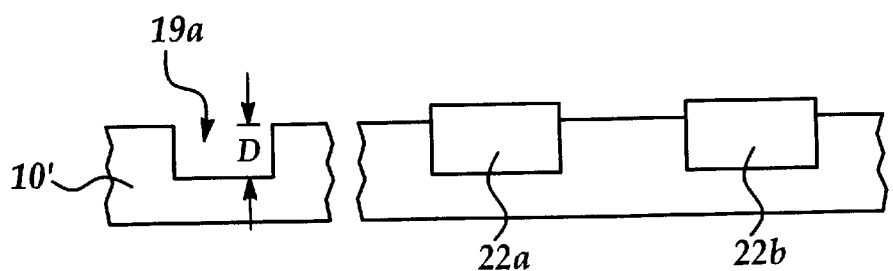

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated microelectronic fabrication otherwise equivalent to the semiconductor integrated circuit microelectronic fabrication whose schematic cross-sectional diagram is illustrated in FIG. 2, but wherein, in a first instance, the series of patterned photoresist layers 18a, 18b, 18c and 18d has been stripped from the series of optional patterned anti-reflective coating (ARC) layers 16a, 16b, 16c and 16d.

The series of patterned photoresist layers 18a, 18b, 18c and 18d may be stripped from the series of optional patterned anti-reflective coating (ARC) layers 16a, 16b, 16c and 16d as is illustrated in FIG. 2 to provide in part the semiconductor integrated circuit microelectronic fabrication whose schematic cross-sectional diagram is illustrated in FIG. 3 while employing methods as are conventional in the art of microelectronic fabrication.

Similarly, after having stripped the series of patterned photoresist layers 18a, 18b, 18c and 18d from the series of optional patterned anti-reflective coating layers 16a, 16b, 16c and 16d as illustrated within the schematic cross-sectional diagram of FIG. 2, there is then formed within the pair of isolation trenches 19b and 19c, but not within the alignment mark 19a, a pair of isolation regions 22a and 22b.

Within the preferred embodiment of the present invention, the pair of isolation regions 22a and 22b may be formed employing methods and materials as are conventional in the art of microelectronic fabrication. Such methods will typically and preferably include chemical mechanical polish (CMP) planarizing methods which employ at least the series of patterned silicon nitride layers 14a, 14b, 14c and 14d as a series of planarizing stop layers, when forming the pair of isolation regions 22a and 22b typically and preferably at least in part of a silicon oxide material.

As is finally illustrated within the schematic cross-sectional diagram of FIG. 3, after having formed the pair of isolation regions 22a and 22b within the pair of isolation trenches 19b and 19c, but not within the alignment mark 19a, the remaining series of optional patterned anti-reflective coating (ARC) layers 16a, 16b, 16c and 16d, series of patterned silicon nitride layers 14a, 14b, 14c and 14d and series of patterned pad oxide layers 12a, 12b, 12c and 12d are stripped from the etched semiconductor substrate 10'. The foregoing series of patterned layers may be stripped while employing methods and materials as are conventional in the art of semiconductor integrated circuit microelectronic fabrication.

Figure 4:
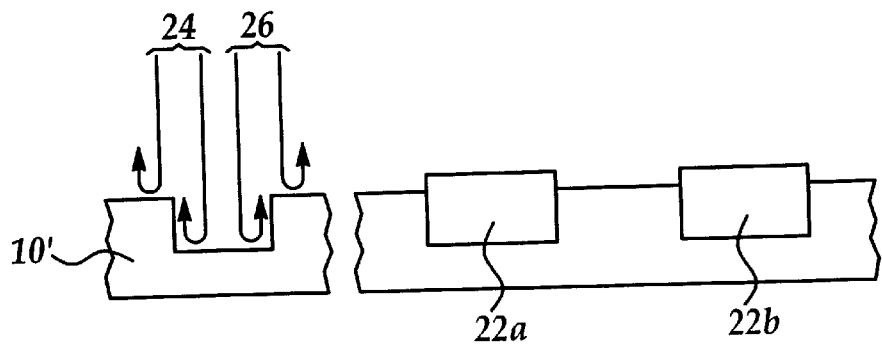

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4, is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein the alignment mark 19a is illuminated with both a first alignment radiation beam 24 and a second alignment radiation beam 26. Although omitted for clarity within the schematic cross-sectional diagram of FIG. 4, the first alignment radiation beam 24 and the second alignment radiation beam 26 are employed for aligning an extrinsic photomask with respect to the partially etched substrate 10', wherein the extrinsic photomask is employed for photoexposing a blanket photoresist layer formed over the partially etched substrate 10'.

Within the preferred embodiment of the present invention when the alignment mark 19a is formed to the depth D within the semiconductor substrate of from about 3000 to about 4500 angstroms, more preferably from about 3200 to about 4200 angstroms and most preferably from about 3500 to about 4000 angstroms, the first alignment radiation beam 24 typically and preferably employs a first alignment radiation wavelength of from about 580 to about 700 nanometers and the second alignment radiation beam 26 typically and preferably employs a second alignment radiation wavelength of from about 480 to about 560 nanometers.

Within the context of the present invention and the preferred embodiment of the present invention, and by employing the first alignment radiation beam 24 and the second alignment radiation beam 26 of the foregoing separate wavelength ranges, and the alignment mark of the foregoing depth D, there may be optimized an alignment signal sensitivity when aligning the etched semiconductor substrate 10' whose schematic cross-sectional diagram is illustrated within FIG. 4 incident to further processing of the etched semiconductor substrate 10' whose schematic cross-sectional diagram is illustrated in FIG. 4.

Figure 5:
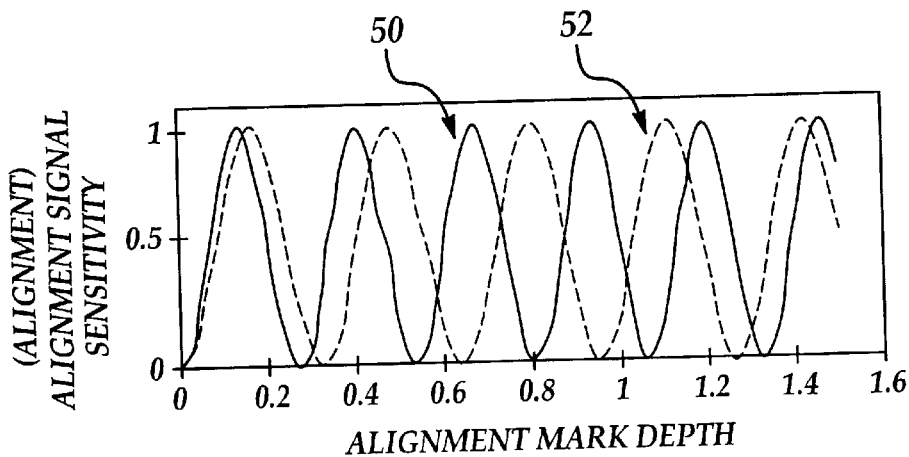
FIG. 5 and FIG. 6 show a pair of graphs of Alignment Signal Sensitivity versus Alignment Mark Depth for a microelectronic fabrication fabricated in accord with the present invention.

Referring now to FIG. 5, there is shown a graph of Alignment Signal Sensitivity versus Alignment Mark Depth for an alignment mark illuminated employing either a 532 nanometer alignment radiation wavelength (i.e., the curve which corresponds with reference numeral 50) or a 632 nanometer alignment radiation wavelength (i.e., the curve which corresponds with reference numeral 52).

As is illustrated within the graph of FIG. 5, the alignment signal sensitivity for either the 532 nanometer alignment radiation wavelength or the 632 nanometer alignment radiation wavelength is varies sinusoidally.

Figure 6:
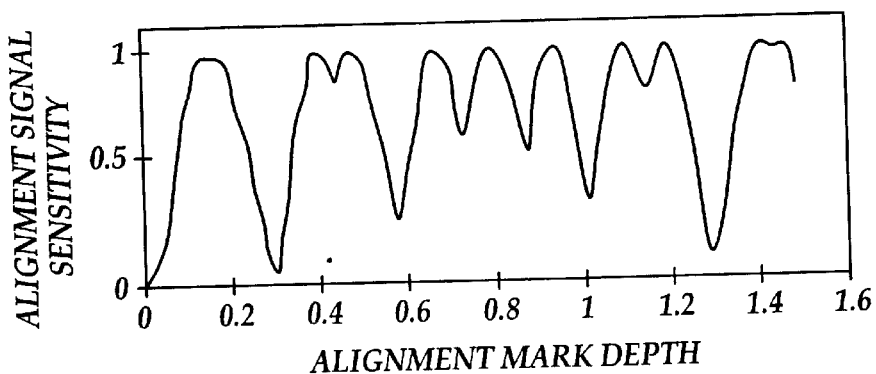

Referring now to FIG. 6, there is shown a graph of Alignment Signal Sensitivity versus Alignment Mark Depth for an aggregate (curve which corresponds with reference numeral 60) of the individual alignment signal sensitivities as illustrated within the graph of FIG. 5. Individual alignment signal sensitivities are proportional to $\sin^2(\delta)$, where $\delta$ is determined employing equation 1, as follows.

$$-\delta = 2\pi D/\lambda \quad (1)$$

Within equation 1, D equals alignment mark depth and $\lambda$ equals alignment wavelength.

As is illustrated within the graph of FIG. 6, the aggregate alignment signal sensitivity with respect to the two alignment wavelengths is generally enhanced in comparison with the alignment signal sensitivities for the individual alignment wavelengths as illustrated within the graph of FIG. 5 (i.e., the aggregate alignment signal sensitivity is greater than 0.5 for more alignment mark depths than it is less than 0.5).

As is understood by a person skilled in the art, the preferred embodiment of the present invention is illustrative of the present invention rather than limiting of the present invention. Revisions and modifications may be made to methods, materials, structures and dimensions employed within the context of the preferred embodiment of the present invention, while still providing a method for fabricating a microelectronic fabrication in accord with the present invention, further in accord with the accompanying claims.

What is claimed is:

1. A method for fabricating a microelectronic fabrication comprising:

providing a substrate;

forming simultaneously within the substrate an alignment mark and an isolation trench formed employing a single etch method and to an identical depth within the substrate;

forming within the isolation trench an isolation region; and further processing the substrate while aligning the substrate while using the alignment mark in conjunction with a minimum of two alignment wavelengths.

2. The method of claim 1 wherein the substrate is employed within a microelectronic fabrication selected from the group consisting integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the identical depth is from about 3000 to about 4500 angstroms.

4. The method of claim 1 wherein the isolation region is formed of a silicon oxide dielectric material.

5. The method of claim 1 wherein:

a first of the minimum of two alignment wavelengths is from about 580 to about 700 nanometers; and a second of the minimum of two alignment wavelengths is from about 480 to about 560 nanometers.

6. A method for fabricating a semiconductor integrated circuit microelectronic fabrication comprising:

providing a semiconductor substrate;

forming simultaneously within the semiconductor substrate an alignment mark and an isolation trench formed employing a single etch method and to an identical depth within the semiconductor substrate;

forming within the isolation trench an isolation region; and further processing the semiconductor substrate while aligning the semiconductor substrate while using the alignment mark in conjunction with a minimum of two alignment wavelengths.

7. The method of claim 6 wherein the identical depth is from about 3000 to about 4500 angstroms.

8. The method of claim 6 wherein the isolation region is formed of a silicon oxide dielectric material.

9. The method of claim 6 wherein:

a first of the minimum of two alignment wavelengths is from about 580 to about 700 nanometers; and a second of the minimum of two alignment wavelengths is from about 480 to about 560 nanometers.

* * * * *